(12) United States Patent
Lee

(10) Patent No.: US 8,826,849 B2
(45) Date of Patent: Sep. 9, 2014

(54) LIQUID MATERIAL DISPENSING APPARATUS AND METHOD OF DISPENSING LIGHT EMITTING MATERIALS FOR ORGANIC LIGHT EMITTING DIODE

(75) Inventor: Kyung-Jun Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 568 days.

(21) Appl. No.: 13/024,229

(22) Filed: Feb. 9, 2011

(65) Prior Publication Data

US 2011/0193104 A1 Aug. 11, 2011

(30) Foreign Application Priority Data

Feb. 9, 2010 (KR) .................. 10-2010-0012019

(51) Int. Cl.
*B05B 3/00* (2006.01)

(52) U.S. Cl.
USPC ........... 118/323; 118/321; 118/300; 118/313; 118/315

(58) Field of Classification Search
USPC ........... 118/321, 323, 313–315, 319, 320, 52, 118/612, 300; 134/167 R; 427/427.1–427.3; 257/88
See application file for complete search history.

(56) References Cited

U.S. PATENT DOCUMENTS

| 4,781,517 A | * | 11/1988 | Pearce et al. | .................. | 414/590 |
| 4,850,382 A | * | 7/1989 | Williams | .................. | 134/167 R |
| 6,196,670 B1 | | 3/2001 | Saruta | | |
| 2006/0073270 A1 | | 4/2006 | Kawase | | |
| 2007/0215041 A1 | | 9/2007 | Kimura | | |

FOREIGN PATENT DOCUMENTS

| JP | 2002-185105 A | 6/2002 |
| JP | 2003-305832 A | 10/2003 |
| JP | 2004-298843 A | 10/2004 |
| JP | 2005-319425 A | 11/2005 |
| JP | 2007-190545 (A) | 8/2007 |
| JP | 2007-252967 A | 10/2007 |
| JP | 2008-155175 (A) | 7/2008 |
| KR | 10-2003-0097489 A | 12/2003 |
| KR | 10-0583363 B1 | 5/2006 |
| KR | 10-2007-0073458 A | 7/2007 |
| KR | 10-2008-0015651 A | 2/2008 |

OTHER PUBLICATIONS

Korean Office Action dated Apr. 29, 2011 for Korean Patent Application No. KR 10-2010-0012019 which corresponds to captioned U.S. Appl. No. 13/024,229.

(Continued)

*Primary Examiner* — Yewebdar Tadesse
(74) *Attorney, Agent, or Firm* — Knobbe, Martens, Olson & Bear, LLP

(57) ABSTRACT

A liquid dispensing apparatus is disclosed. In one embodiment, the apparatus includes i) a first moving unit configured to move in a first direction that is a movement direction of a patterning target object and ii) a second moving unit configured to move in a second direction crossing the first direction. The apparatus further includes a dispensing unit formed on the second moving unit; and a third moving unit formed between the first moving unit and the second moving unit and configured to rotate the second moving unit and the dispensing unit with respect to the first moving unit on a virtual plane that is substantially parallel to the first and second directions.

13 Claims, 7 Drawing Sheets

(56) References Cited

OTHER PUBLICATIONS

Korean Registration Determination Certificate dated May 18, 2012 for Korean Patent Application No. KR 10-2010-0012019 which corresponds to captioned U.S. Appl. No. 13/024,229.

Japanese Office Action dated May 7, 2014 for Japanese Patent Application No. JP 2010-288425 which shares priority of Korean Patent Application No. KR 10-2010-0012019 with captioned U.S. Appl. No. 13/024,229.

* cited by examiner

LIQUID MATERIAL DISPENSING APPARATUS AND METHOD OF DISPENSING LIGHT EMITTING MATERIALS FOR ORGANIC LIGHT EMITTING DIODE

RELATED APPLICATIONS

This application claims the benefit of Korean Patent Application No. 10-2010-0012019, filed on Feb. 9, 2010, in the Korean Intellectual Property Office, the disclosure of which is incorporated herein in its entirety by reference.

BACKGROUND

1. Field

The described technology generally relate to a liquid material dispensing apparatus and a method of dispensing light emitting materials for an organic light emitting diode (OLED).

2. Description of the Related Technology

Recently, the size of a flat panel display substrate has been increased to improve productivity and make the panel larger. Thus, there is a demand for an inkjet patterning technology for replacing a conventional photo process using a mask. The inkjet patterning technology involves directly forming a pattern on a substrate by dispensing a minute liquid drop at a desired position. By using the inkjet patterning technology, the pattern is formed in one process so that it is advantageous for reducing the number of processes, compared to a conventional photo process including exposing, developing, and etching processes.

SUMMARY

One inventive aspect is a liquid dispensing apparatus and a method of dispensing light emitting materials for an organic light emitting diode (OLED), which are able to facilitate discharge of a liquid in a diagonal direction and to be easily applied to an enlarged substrate.

Another aspect is a liquid dispensing apparatus which includes first and second moving units configured to respectively move in a first direction that is a movement direction of a patterning target object, and a second direction crossing the first direction; a dispensing unit mounted on the second moving unit; and a third moving unit mounted between the first moving unit and the second moving unit so as to rotate the second moving unit with respect to the first moving unit on a virtual plane that is parallel to the first and second directions.

The dispensing unit may move in the second direction, and the second direction may be changed according to the rotation of the third moving unit.

The first moving unit may include one or more guide rails extending in the first direction, and a moving member coupled to the one or more guide rails and slidable on the one or more guide rails.

The moving member of the first moving unit may be retracted and extended in a longitudinal direction of the moving member.

The second moving unit may include a straight-line guide member mounted in the third moving unit, and a moving member mounted on the straight-line guide member so as to move in an extending direction of the straight-line guide member.

The third moving unit may include a circular-shape guide member, and a rotating wheel mounted on the circular-shape guide member so as to rotate around a center point of the circular-shape guide member.

The circular-shape guide member may be fixedly mounted on a movable portion of the first moving unit, and the rotating wheel is fixedly mounted below the second moving unit. The rotating wheel may be disposed whereby at least a part of the rotating wheel is arranged inside the circular-shape guide member. The rotating wheel may be disposed whereby at least a part of the rotating wheel is arranged inside the second moving unit.

A maximal movement range for a dispensing operation by the dispensing unit may be equal to or less than an inner diameter of the circular-shape guide member. The inner diameter of the circular-shape guide member may be greater than a length of the patterning target object, wherein the length is in the second direction crossing the first direction.

The dispensing unit may move in three degrees of freedom by using the first moving unit, the second moving unit, and the third moving unit.

The dispensing unit may include at least a pair of red (R), green (G), and blue (B) light emitting materials for an organic light emitting diode (OLED).

Another aspect is a method of dispensing light emitting materials for an organic light emitting diode (OLED), the method including the operations of arranging a second moving unit mounted on a first moving unit configured to move in a first direction that is a movement direction of a patterning target object, so as to allow the second moving unit to move in a direction crossing the first direction; moving the first moving unit and the second moving unit, and dispensing a light emitting material on first organic light emitting diodes (OLEDS) arranged in the first and second directions by using a dispensing unit mounted on the second moving unit; and moving the first moving unit and the second moving unit and a third moving unit rotatably mounted between the first moving unit and the second moving unit, and dispensing the light emitting material on second OLEDs arranged in a direction at an angle with respect to the first and second directions.

Another aspect is a liquid dispensing apparatus comprising: a first moving unit configured to move in a first direction that is a movement direction of a patterning target object; a second moving unit configured to move in a second direction crossing the first direction; a dispensing unit formed on the second moving unit; and a third moving unit formed between the first moving unit and the second moving unit and configured to rotate the second moving unit and the dispensing unit with respect to the first moving unit on a virtual plane that is substantially parallel to the first and second directions.

In the above apparatus, the dispensing unit is configured to move in the second direction, and wherein the second direction is changed according to the rotation of the third moving unit. In the above apparatus, the first moving unit comprises i) at least one guide rail extending in the first direction, and ii) a moving member coupled to and slidable on the at least one guide rail.

In the above apparatus, the moving member of the first moving unit is configured to retract and extend in direction substantially perpendicular to the guide rail. In the above apparatus, the second moving unit comprises i) a linear guide member formed in the third moving unit, and ii) a moving member formed on the linear guide member and configured to move in an extending direction of the linear guide member. In the above apparatus, the third moving unit comprises i) a circular-shape guide member, and ii) a rotating wheel formed on the circular-shape guide member and configured to rotate around a center point of the circular-shape guide member.

In the above apparatus, the circular-shape guide member is fixed to a movable portion of the first moving unit, and wherein the rotating wheel is formed below the second moving unit. In the above apparatus, at least a portion of the rotating wheel is formed inside the circular-shape guide member. In the above apparatus, at least a portion of the rotating wheel is formed inside the second moving unit. In the above apparatus, a maximal movement range for a dispensing operation by the dispensing unit is less than or equal to an inner diameter of the circular-shape guide member.

In the above apparatus, the inner diameter of the circular-shape guide member is greater than a length of the patterning target object, and wherein the length is defined in the second direction. In the above apparatus, the dispensing unit is configured to freely move in at least three different directions with the use of the first moving unit, the second moving unit, and the third moving unit. In the above apparatus, the dispensing unit is further configured to dispense at least a pair of red (R), green (G), and blue (B) light emitting materials for an organic light emitting diode (OLED).

Another aspect is a method of dispensing light emitting materials for an organic light emitting diode (OLED), the method comprising: providing a first moving unit configured to move in a first direction that is a movement direction of a patterning target object; providing a second moving unit configured to move in a second direction crossing the first direction; providing a dispensing unit on the second moving unit, wherein the dispensing unit is configured to dispense a light emitting material; providing a third moving unit rotatably formed between the first moving unit and the second moving unit; moving the first moving unit and the second moving unit so that the dispensing unit dispenses the light emitting material on a first group of OLEDs arranged in the first and second directions; and moving the first, second and third moving units so that the dispensing unit dispense the light emitting material on a second group of OLEDs arranged in a diagonal direction with respect to the first and second directions.

The above method further comprises rotating the third moving unit so as to rotate the second moving unit. In the above method, the second moving unit comprises a guide member and a moving member, wherein the dispensing unit is configured to dispense the light emitting material via a dispensing head, wherein the first and second directions are substantially perpendicular to each other, and wherein the method further comprises moving the dispensing unit and moving member of the second moving unit in a diagonal direction with respect to the first and second directions. In the above method, the diagonal movement of the dispensing unit and moving member is performed without separately rotating the dispensing head of the dispensing unit.

Another aspect is a liquid dispensing apparatus comprising: a dispensing unit configured to dispense a patterning material toward a target object; a first linear moving unit configured to move the dispensing unit in a first direction; a second linear moving unit configured to move the dispensing unit in a second direction crossing the first direction; and a circular moving unit configured to rotate the dispensing unit and second linear moving unit.

In the above apparatus, the dispensing unit is formed on the second linear moving unit, and wherein the circular moving unit is formed between the first and second linear moving units. In the above apparatus, the second linear moving unit comprises i) a linear guide member formed so as to cross the circular moving member and ii) a moving member formed on the linear guide member and facing the target object, wherein the dispensing unit is formed on the moving member, and wherein the moving member is configured to move the dispensing unit along the linear guide member.

DETAILED DESCRIPTION

Recently, a multi-model on a glass (MMG) method has been developed for commercial applications of flat panel displays. The MMG method involves appropriately distributing and arranging different size cell areas on one substrate so as to increase use of the substrate. The MMG method involves arranging cells having a first size in predetermined rows and columns and arranging cells having a different size from the first size in the rest of the cell areas. It is difficult to apply a typical inkjet dispensing apparatus to the MMG method, because a stage having a substrate arranged thereon or an inkjet head including a liquid to be discharged is moved in X-axis, Y-axis, and Z-axis directions and then dispensed in the inkjet dispensing apparatus.

Further, since an inkjet head of the above dispensing apparatus is moved only in X-axis, Y-axis, and Z-axis directions, the liquid is not dispensed exactly in the diagonal direction. Also, due to enlargement of a substrate, the stage has to be enlarged. However, when the enlarged stage rotates and is moved, the substrate may be contaminated by dispensing particles such as organic light emitting materials or an excessive load may be applied to the stage, thereby causing a high possibility of damaging the inkjet dispensing apparatus.

Reference will now be made in detail to embodiments, examples of which are illustrated in the accompanying drawings.

Figure 1:
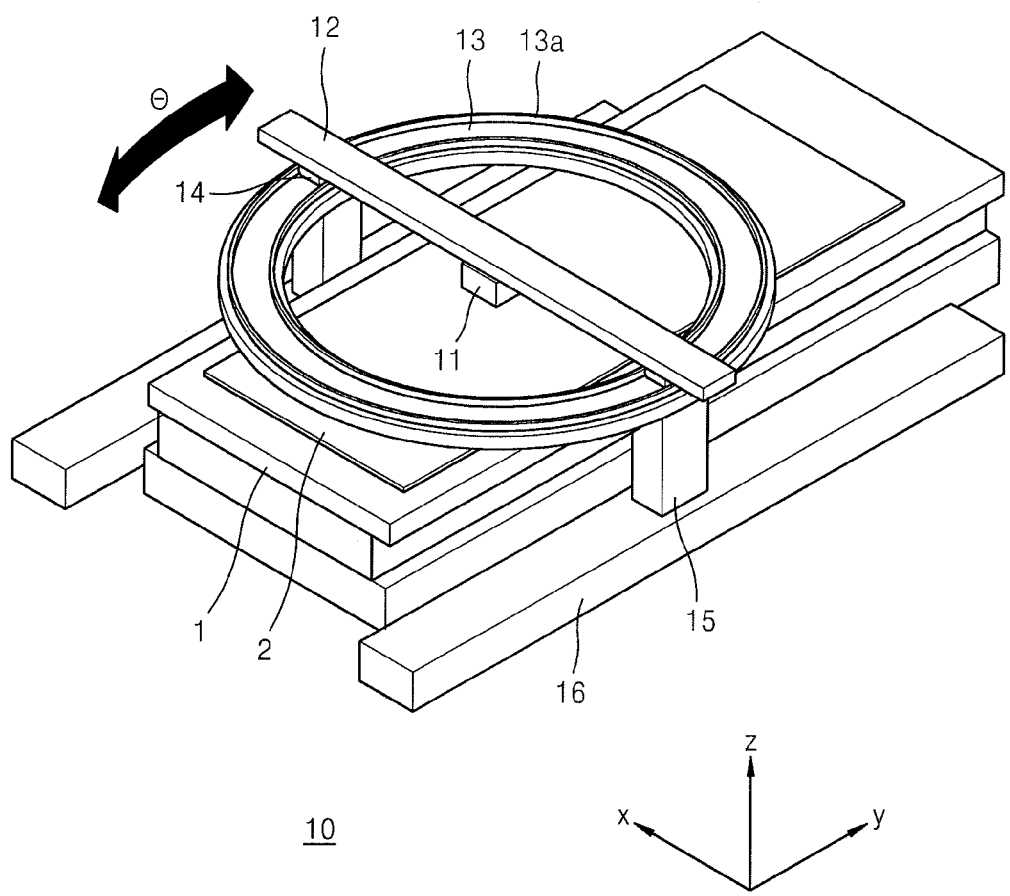
FIG. 1 is a perspective view of a liquid dispensing apparatus according to an embodiment.
Figure 2:
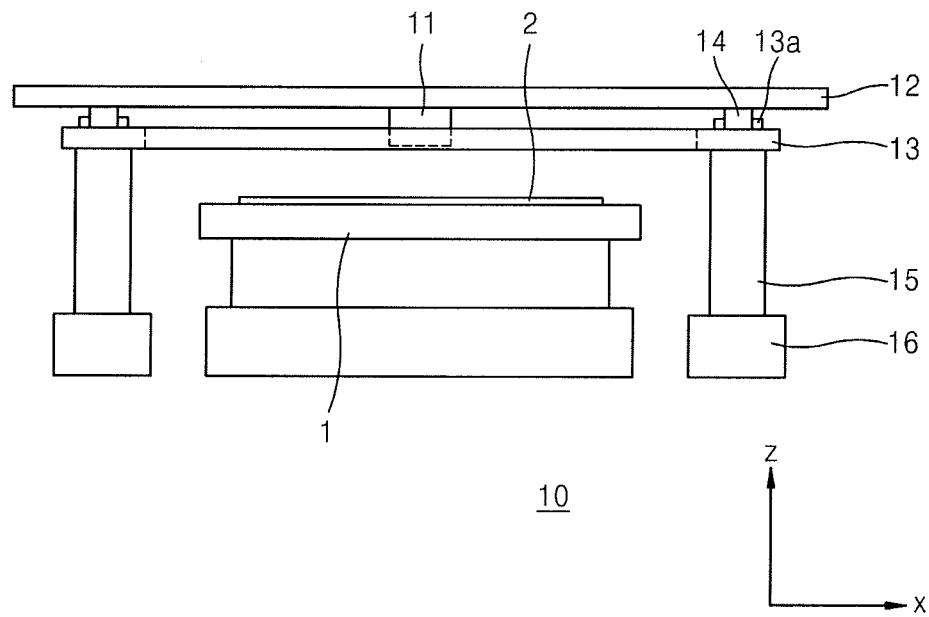
FIG. 2 is a front view of the liquid dispensing apparatus of FIG. 1.

FIG. 1 is a perspective view of a liquid dispensing apparatus according to an embodiment. FIG. 2 is a front view of the liquid dispensing apparatus of FIG. 1.

Referring to FIGS. 1 and 2, the liquid dispensing apparatus includes a first moving unit or a first linear moving unit (15, 16), a second moving unit or a second linear moving unit (11, 12), and a third moving unit or a circular moving unit (13, 14). A substrate 2 is formed on a stage 1.

The first moving unit (15, 16) is movable in a first direction, for example, in a Y-axis direction. For example, the first moving unit (15, 16) includes a guide rail 16 and a moving member 15. In one embodiment, the guide rail 16 is formed of two rails each extending in the Y-axis direction. The moving member 15 may slide on each of the guide rails 16 in the Y-axis direction. In this embodiment, the moving member 15 is movable in the Y-axis direction along each of the guide rails 16.

The second moving unit (11, 12) is movable in a second direction. The second direction crosses the first direction, and may be an X-axis direction. However, the second direction may be other directions. The second moving unit (11, 12) includes a straight-line guide member (or linear guide member) 12 and a moving member 11. The straight-line guide member 12 is rotatably mounted on the third moving unit (13, 14) to be described later. The moving member 11 is mounted below the straight-line guide member 12. A dispensing unit (not shown) is mounted below the moving member 11. Although the dispensing unit is not illustrated in the drawings, so as to avoid complexity, hereinafter, for convenience of description, it is assumed that the moving member 11 of the second moving unit (12, 11) corresponds to the dispensing unit.

In one embodiment, the dispensing unit is an inkjet head for discharging a liquid. The dispensing unit may contain and dispense various liquids. For example, the dispensing unit may include red (R), green (G), and blue (B) light emitting materials for an organic light emitting diode (OLED). Also, for improvement of mass productivity, a plurality of pairs of R, G, and B light emitting materials each forming a pair may be arranged in a single direction in the dispensing unit.

The moving member 11 of the second moving unit (12, 11) may move along the straight-line guide member 12. In one embodiment, the straight-line guide member 12 having the moving member 11 mounted therebelow rotationally moves on a virtual plane substantially parallel to the X and Y axes in the second moving unit (12, 11), so that a movement direction of the moving member 11 is substantially continuously changed. That is, since the straight-line guide member 12 rotates above the third moving unit (13, 14), the second moving unit (11, 12) may move in a direction crossing the Y-axis, or may move in substantially the same direction as the Y-axis. However, since movement in the Y-axis direction is performed by the first moving unit (15, 16), hereinafter, for convenience of description, it is assumed that the second moving unit (11, 12) only moves in the direction crossing the Y-axis.

The third moving unit (13, 14) is configured to rotate the second moving unit (11, 12) on a virtual plane in a Z-axis substantially parallel to the X and Y axes. The third moving unit (13, 14) is arranged between the first moving unit (15, 16) and the second moving unit (11, 12). For example, the third moving unit (13, 14) includes a circular-shape guide member 13 and a rotating wheel 14. In the present embodiment, the circular-shape guide member 13 is fixedly mounted on the moving member 11 of the second moving unit (12, 11), and the rotating wheel 14 is mounted below the straight-line guide member 12 of the second moving unit (12, 11) so as to allow the straight-line guide member 12 to rotate. In this embodiment, the rotating wheel 14 rotates on the circular-shape guide member 13 in a clockwise or counterclockwise direction, so that the straight-line guide member 12 of the second moving unit (12, 11) rotates together with the rotating wheel 14. Thus, the movement direction of the moving member 11 of the second moving unit (12, 11) is changed according to the rotation of the rotating wheel 14 of the third moving unit (13, 14).

Figure 3:
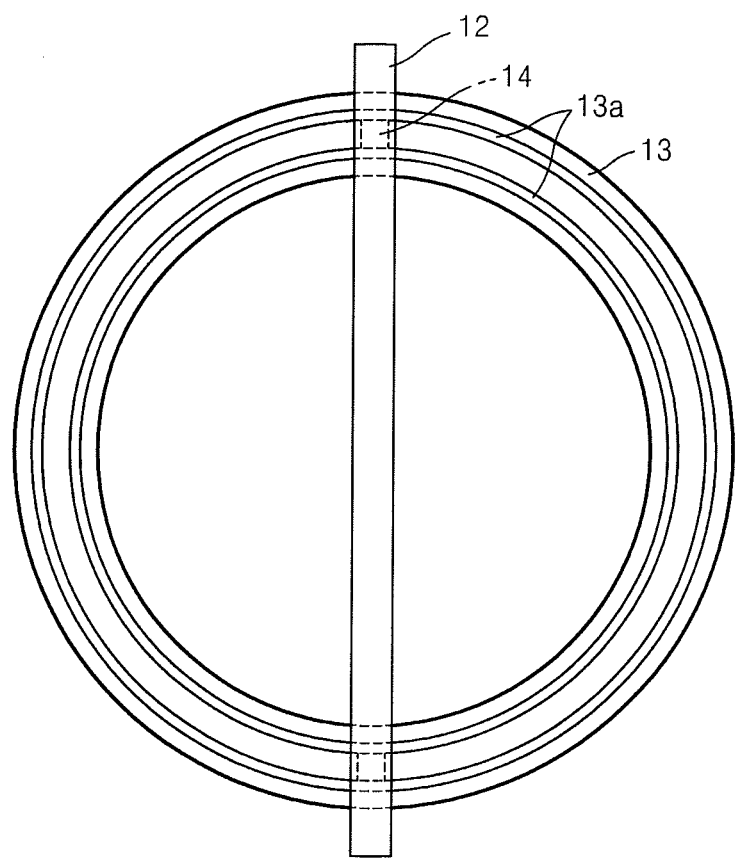
FIG. 3 is a plane view illustrating a portion of the liquid dispensing apparatus of FIG. 1.

The rotating wheel 14 may be driven in various manners. For example, the rotating wheel 14 may be directly driven so that the straight-line guide member 12 of the second moving unit (12, 11) having the rotating wheel 14 mounted therebelow may rotate along the circular-shape guide member 13. Here, a driving motor may be coupled to each of two rotating wheels 14, or a rotation drive of a driving motor coupled to one rotating wheel 14 may rotate the other rotating wheel 14. In this case, a wheel separation preventing unit 13a may be arranged above the circular-shape guide member 13 of the third moving unit (13, 14) so as to prevent the rotating wheel 14 from being separated from a rotation path. In one embodiment, as illustrated in FIG. 3, the wheel separation preventing unit 13a is formed to be circular so as to encircle side ends of the rotating wheel 14.

Figure 4:
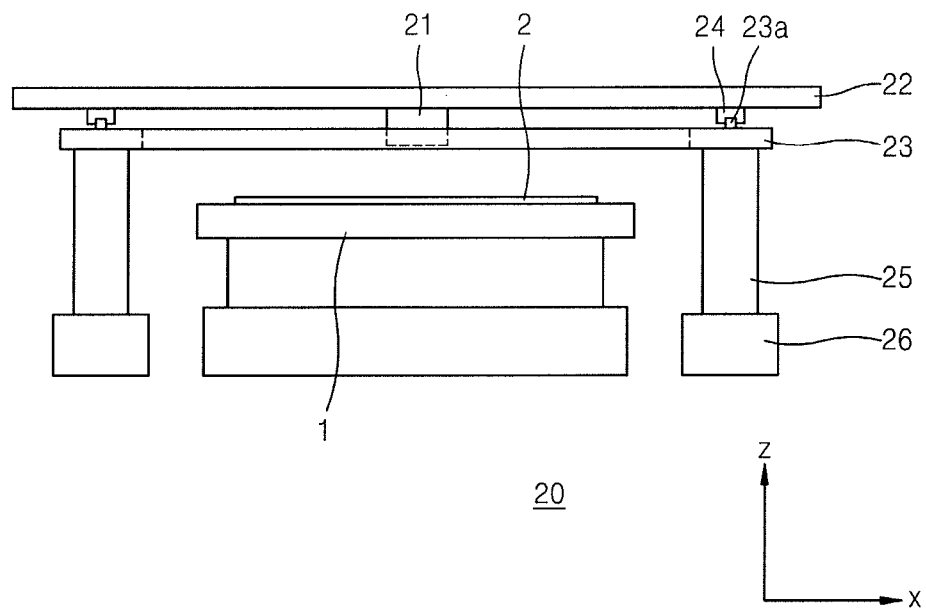
FIG. 4 is a front view of a liquid dispensing apparatus according to another embodiment.

Unlike this, as illustrated in FIG. 4, a rail unit 23a for guiding rotational movement may project on a top surface of a circular-shape guide member 23 of a third moving unit (23, 24) and correspond to a groove formed in a rotating wheel 24.

The dispensing unit is mounted below the moving member 21 of the second moving unit (22, 21). The second moving unit (21, 22) and the third moving unit (23, 24) are mounted on the first moving unit (25, 26) and move together, so that the dispensing unit may move in the Y-axis direction along the first moving unit (25, 26). Also, the dispensing unit is mounted on the second moving unit (21, 22), a head may move in an arbitrary direction crossing the X-axis. In addition, since the second moving unit (21, 22) is mounted on the third moving unit (23, 24) and moves together with the third moving unit (23, 24), the dispensing unit may perform a dispensing operation not only in the X-axis or Y-axis but also in a diagonal direction. See FIGS. 8B and 8C.

Figure 5:
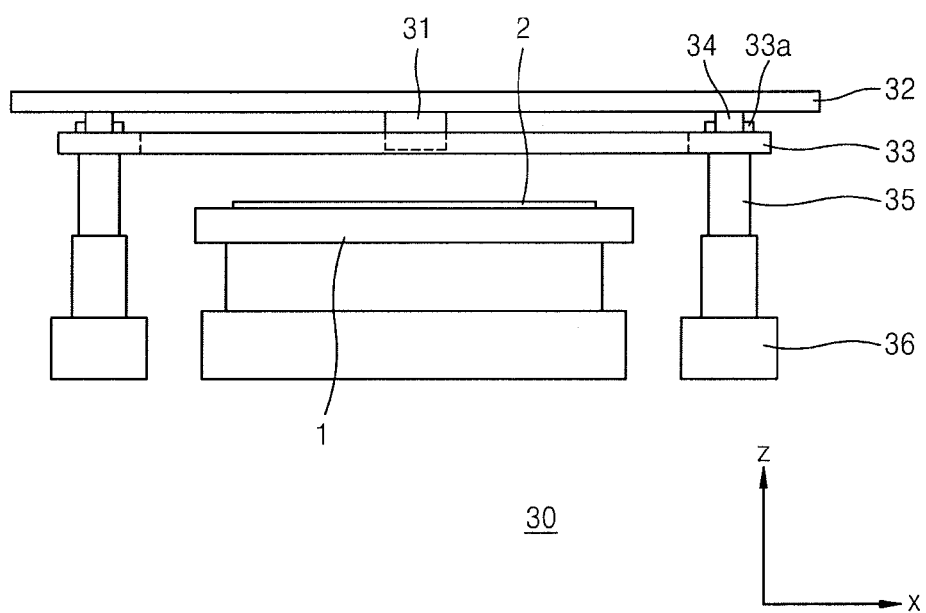
FIG. 5 is a front view of a liquid dispensing apparatus according to another embodiment.

In another embodiment, as illustrated in FIG. 5, a moving member 35 of a first moving unit (35, 36) may be retracted or extended in a substantially vertical direction, for example, in a Z-axis direction. In this embodiment, a third moving unit (33, 34) and a second moving unit (31, 32) may move in the Z-axis direction, and a dispensing unit may also move in the Z-axis direction. According to the embodiment, although types of a stage or types of a substrate for a stage vary, a dispensing operation may be possible without a separate design change.

Figure 6:
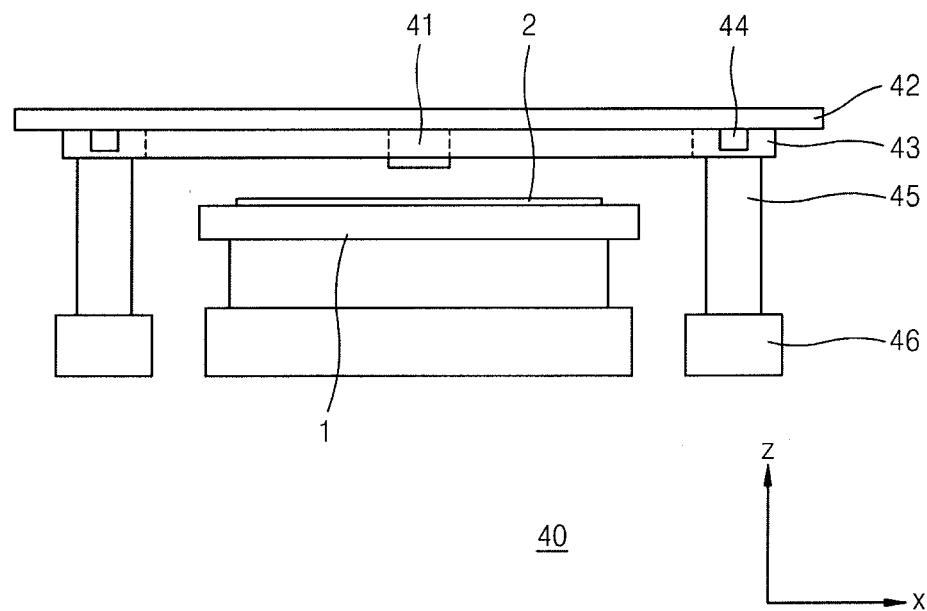
FIG. 6 is a front view of a liquid dispensing apparatus according to another embodiment.

In another embodiment, as illustrated in FIG. 6, a rotating wheel 44 may be arranged inside a circular-shape guide member 43. In this embodiment, the rotating wheel 44 of a third moving unit (43, 44), which is rotationally driven, is not exposed to the outside, so that it is possible to prevent contamination of the rotating wheel 44 due to dusts or dispensing particles. Also, only a part of the rotating wheel 44 may be arranged inside the circular-shape guide member 43. Reference numerals 45 and 46 refer to a first moving unit. Reference numerals 41 and 42 refer to a second moving unit.

Figure 7:
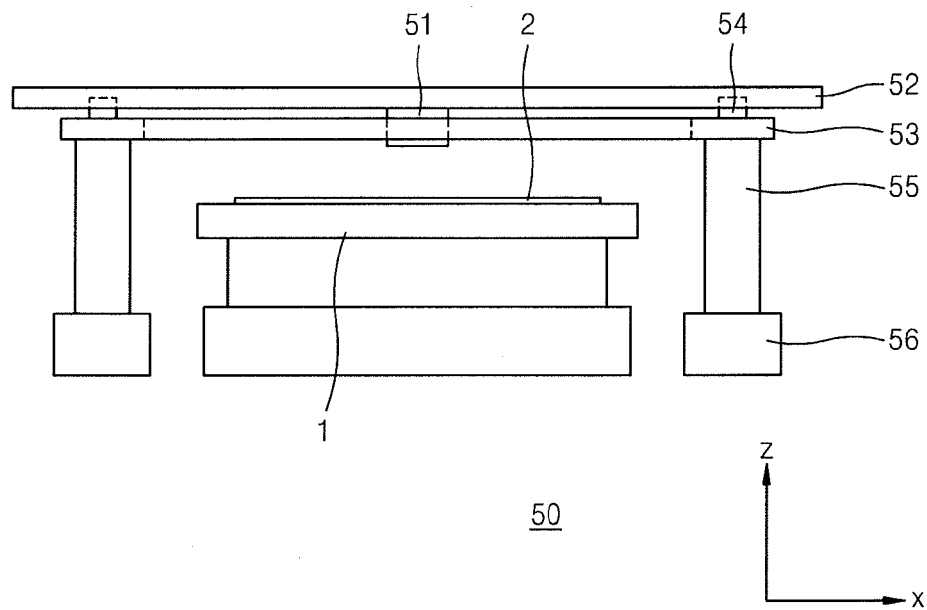
FIG. 7 is a front view of a liquid dispensing apparatus according to another embodiment.

In another embodiment, as illustrated in FIG. 7, a rotating wheel 54 may be arranged inside a second moving unit (51, 52), in particular, inside a straight-line guide member 52. In the present embodiment, the rotating wheel 54 is rotatably mounted inside the straight-line guide member 52 so that a rotating surface of the rotating wheel 54 contacts a circular-shape guide member 53. Reference numerals 55 and 56 refer to a first moving unit. Reference numerals 53 and 54 refer to a third moving unit.

Figure 8A:
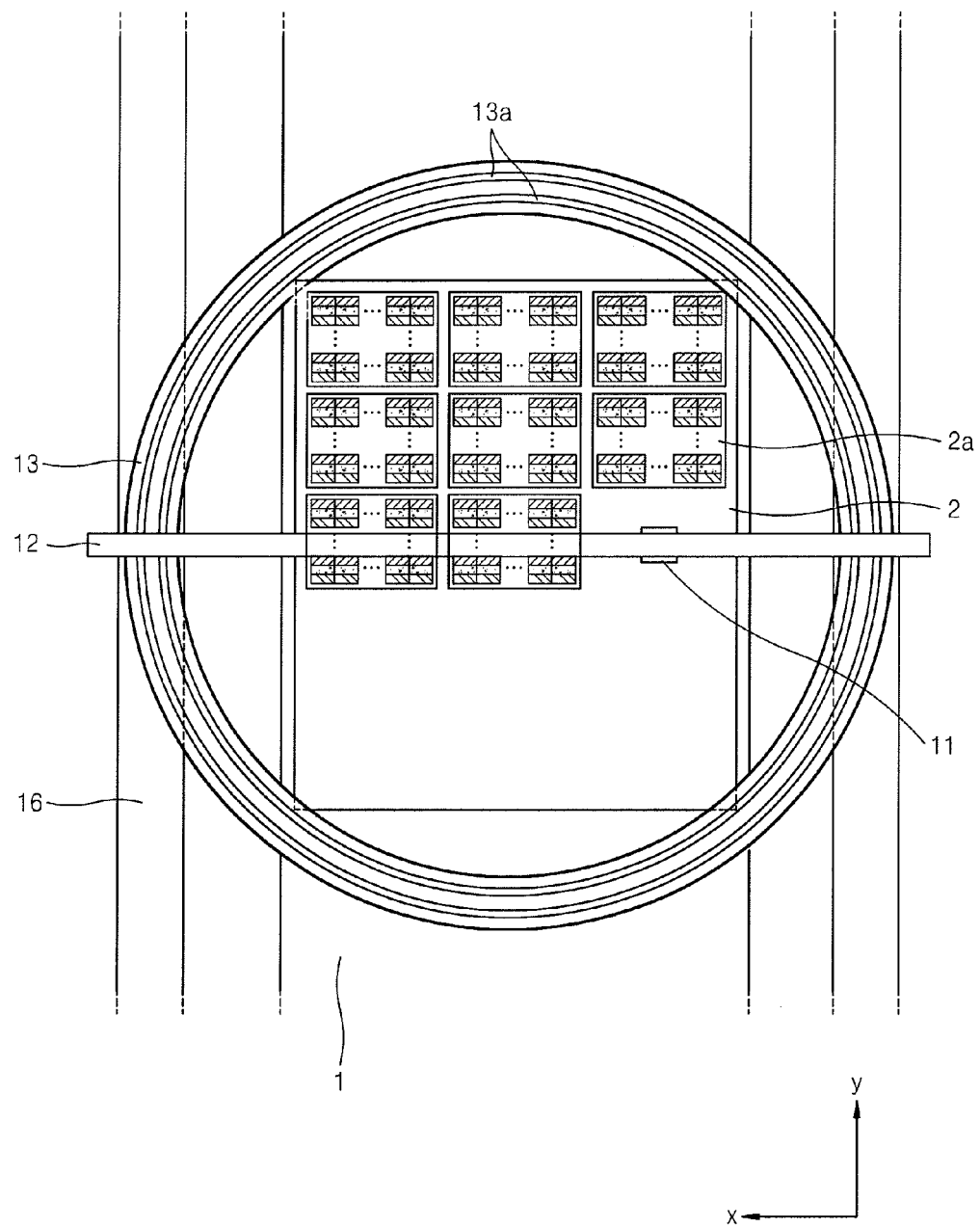
FIGS. 8A through 8C illustrate a method of dispensing a light emitting material for organic light emitting diode (OLED) on a substrate by using the liquid dispensing apparatus according to one embodiment.
Figure 8B:
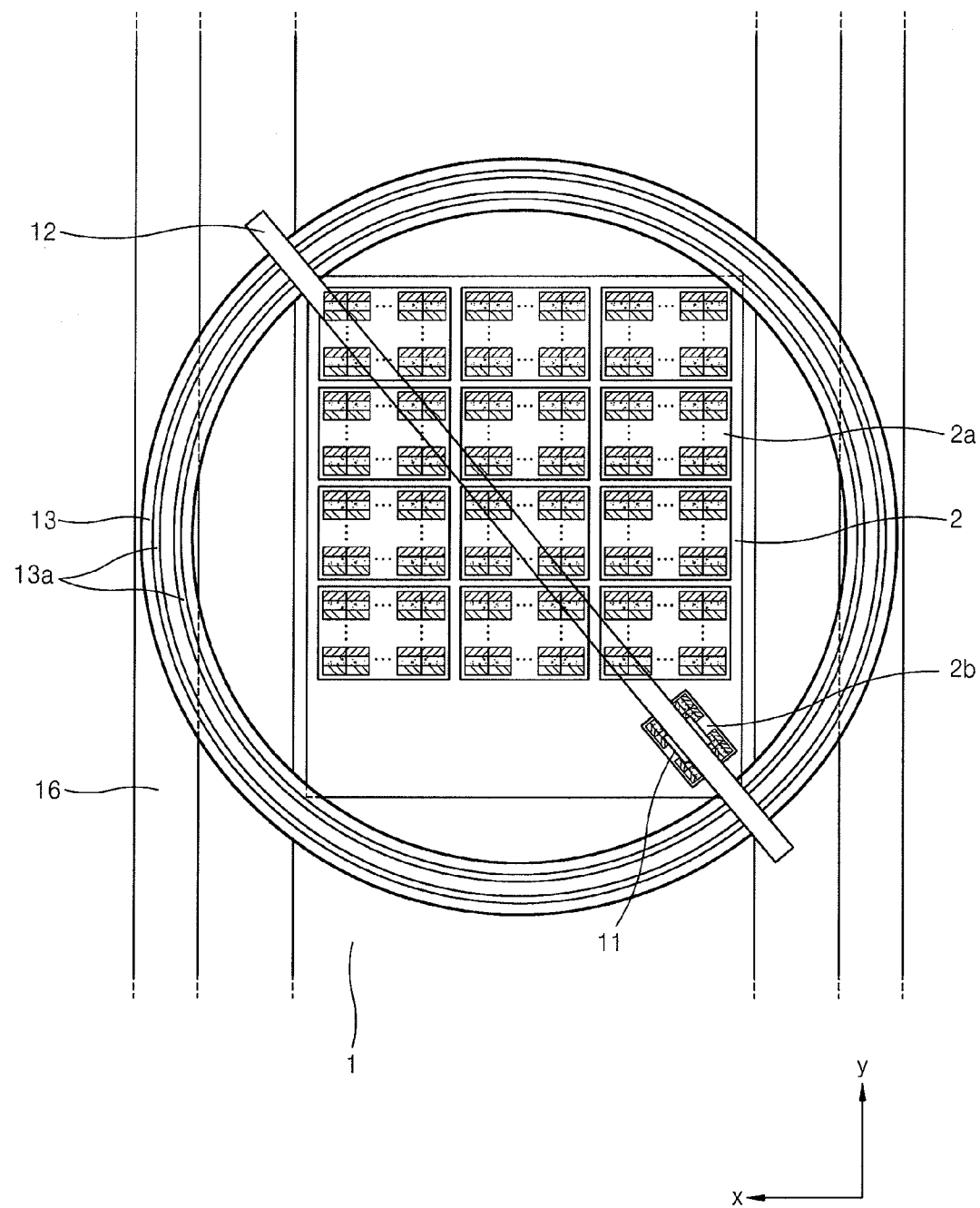
Figure 8C:
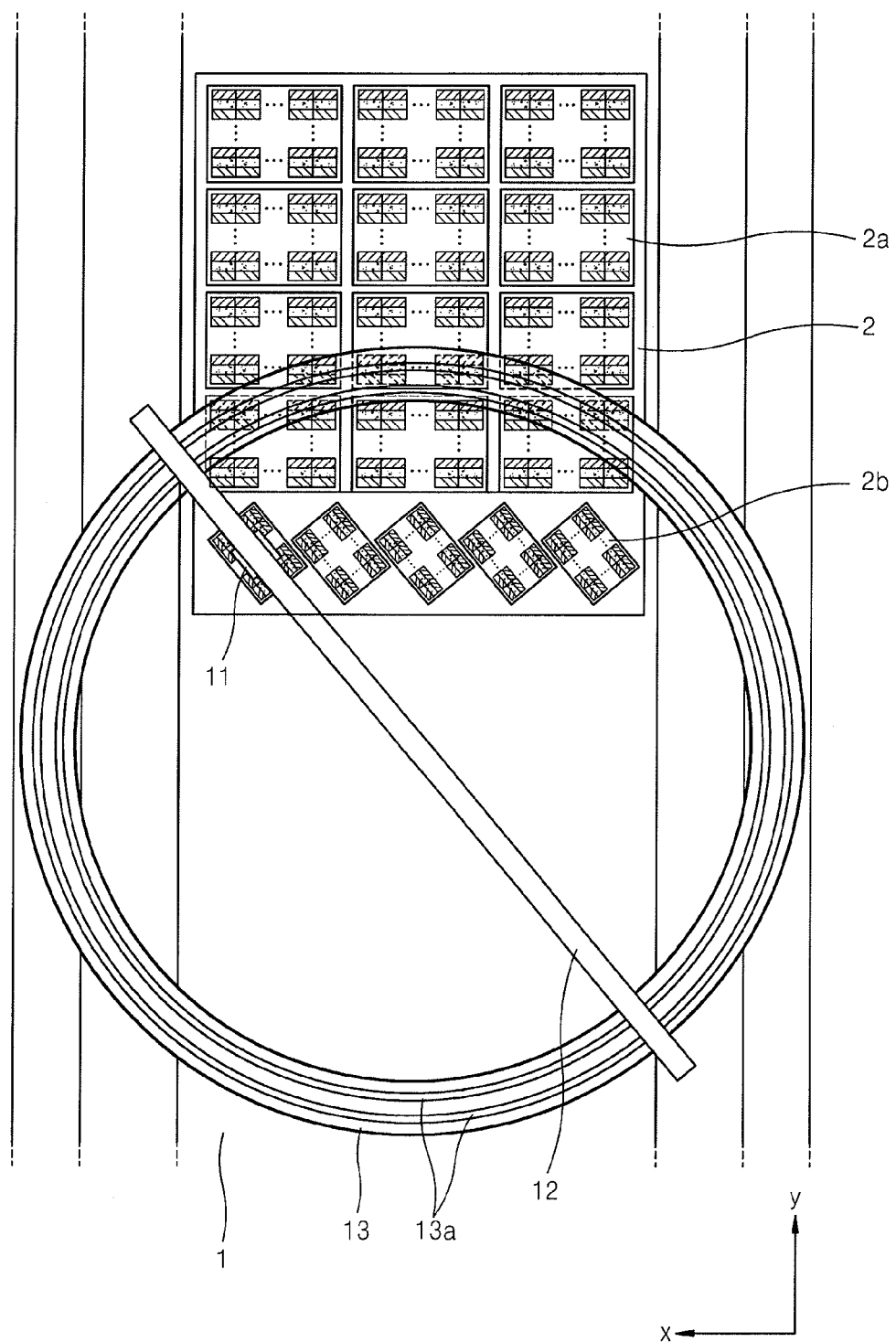

FIGS. 8A through 8C illustrate a process in which the liquid dispensing apparatus, according to one embodiment, dispenses a light emitting material on two types of OLEDs on a substrate according to a multi-model on a glass (MMG) method.

First, as illustrated in FIG. 8A, when the straight-line guide member 12 is substantially parallel to an X-axis by using the third moving unit (13, 14), the dispensing unit dispenses the light emitting material on a region of corresponding cells 2a while the moving member 15 of the first moving unit (15, 16) and the moving member 11 of the second moving unit (11, 12) are moved along the Y and X axes, respectively. Unlike this, the movement in the Y-axis direction may also be performed by moving the stage 1 having the substrate 2 arranged thereon.

In this manner, a process of dispensing the light emitting material on the OWED cells 2a of a first group is complete. Afterward, as illustrated in FIGS. 8B and 8C, the straight-line guide member 12 of the second moving unit (11, 12) is rotated by using the third moving unit (13, 14), the moving member 11 of the second moving unit (11, 12) is disposed on a region of corresponding cells 2b, and then a dispensing operation is performed. In this manner, since the third moving unit (13, 14) may rotate the dispensing unit and the second moving unit (11, 12) that is capable of performing a linear movement, a dispensing operation in a diagonal direction may be easily performed, and the present embodiment may be appropriate for a procedure based on the MMG method.

As described above, the dispensing unit is enabled to move not only in the X and Y axes directions but also in a direction at an arbitrary angle Θ by using the first moving unit (15, 16), the second moving unit (11, 12), and the third moving unit (13, 14), so that the dispensing unit may perform a dispensing operation while freely moving in three different directions (e.g., X-axis, Y-axis and diagonal directions). In the FIG. 3 embodiment, the dispensing unit may perform a dispensing operation while freely moving in four different directions, which include X-axis, Y-axis, Z-axis and diagonal directions.

According to one embodiment, the moving member 11 that is coupled to the dispensing unit substantially linearly moves while the moving member 11 is mounted on the straight-line guide member 12 that may move in any axis direction and may rotate, so as to freely move in two-axes directions crossing each other, and freely move on the same planar surface in a diagonal direction. Thus, compared to a structure in which a dispensing unit rotates while the dispensing unit is mounted on a member that moves in two axes direction (e.g., X and Y axes) crossing each other, the liquid dispensing apparatus according to one embodiment may be appropriate for the MMG method requiring a dispensing operation in the diagonal direction.

Also, in the liquid dispensing apparatus according to one embodiment, the stage 1 is not dispensed on while the stage 1 moves in the X and Y axes, but the stage 1 is dispensed on while the moving member 11 that is coupled to the dispensing unit above the stage 1 substantially linearly moves in X-axis direction and in a direction crossing the X-axis direction and rotates at an arbitrary angle through the first, second, and third units. In this embodiment, the dispensing operation in an entire region of a substrate 2 is possible even when a size of the substrate 2 is enlarged, so that the liquid dispensing apparatus may be appropriate for use in the manufacture of a display including a large substrate.

According to at least one embodiment, a maximal movement range for the dispensing operation by the dispensing unit is less than or equal to an inner diameter of the circular-shape guide member 13. That is, a movement range for the dispensing operation is determined according to the size of the inner diameter of the circular-shape guide member 13. Also, the inner diameter of the circular-shape guide member 13 may be greater than an X-axis directional length of the substrate 2. No matter how much the substrate 2 is enlarged, the liquid dispensing apparatus may be used if the circular-shape guide member 13 has an inner diameter that is a little bit greater than a length in the X-axis direction, that is, a direction crossing in a proceeding direction of the substrate 2. Thus, the liquid dispensing apparatus may be appropriate for a manufacturing field using a large substrate.

The liquid dispensing apparatus according to at least one embodiment may be applied to not only a light emitting layer of the OLED but also applied to coating a color filter or an alignment layer of a liquid crystal display (LCD), or applied to distribution of an inkjet spacer.

The liquid dispensing apparatus according to at least one embodiment may perform the dispensing operation not only in crossing directions but also in a diagonal direction. Also, the liquid dispensing apparatus may be easily applied to a large substrate.

At least one embodiment may be used in an industry for manufacturing and using the liquid dispensing apparatus.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A liquid dispensing apparatus comprising:
 a first moving unit configured to move in a first direction that is a movement direction of a patterning target object;
 a second moving unit configured to move in a second direction crossing the first direction;
 a dispensing unit formed on the second moving unit; and
 a third moving unit formed between the first moving unit and the second moving unit and configured to rotate the second moving unit and the dispensing unit with respect to the first moving unit on a virtual plane that is substantially parallel to the first and second directions, wherein the third moving unit crosses the second moving unit.

2. The apparatus of claim 1, wherein the dispensing unit is configured to move in the second direction, and wherein the second direction is changed according to the rotation of the third moving unit.

3. The apparatus of claim 1, wherein the first moving unit comprises i) at least one guide rail extending in the first direction, and ii) a moving member coupled to and slidable on the at least one guide rail.

4. The apparatus of claim 3, wherein the moving member of the first moving unit is configured to retract and extend in direction substantially perpendicular to the guide rail.

5. The apparatus of claim 1, wherein the second moving unit comprises i) a linear guide member formed in the third moving unit, and ii) a moving member formed on the linear guide member and configured to move in an extending direction of the linear guide member.

6. A liquid dispensing apparatus comprising:
 a first moving unit configured to move in a first direction that is a movement direction of a patterning target object;
 a second moving unit configured to move in a second direction crossing the first direction;
 a dispensing unit formed on the second moving unit; and
 a third moving unit formed between the first moving unit and the second moving unit and configured to rotate the second moving unit and the dispensing unit with respect to the first moving unit on a virtual plane that is substantially parallel to the first and second directions,
 wherein the third moving unit comprises i) a circular-shape guide member, and ii) a rotating wheel formed on the circular-shape guide member and configured to rotate around a center point of the circular-shape guide member.

7. The apparatus of claim 6, wherein the circular-shape guide member is fixed to a movable portion of the first moving unit, and wherein the rotating wheel is formed below the second moving unit.

8. The apparatus of claim 7, wherein at least a portion of the rotating wheel is formed inside the circular-shape guide member.

9. The apparatus of claim 7, wherein at least a portion of the rotating wheel is formed inside the second moving unit.

10. The apparatus of claim 6, wherein a maximal movement range for a dispensing operation by the dispensing unit is less than or equal to an inner diameter of the circular-shape guide member.

11. The apparatus of claim 10, wherein the inner diameter of the circular-shape guide member is greater than a length of the patterning target object, and wherein the length is defined in the second direction.

12. The apparatus of claim 1, wherein the dispensing unit is configured to freely move in at least three different directions with the use of the first moving unit, the second moving unit, and the third moving unit.

13. The apparatus of claim 1, wherein the dispensing unit is further configured to dispense at least a pair of red (R), green (G), and blue (B) light emitting materials for an organic light emitting diode (OLED).

* * * * *